US011567603B2

(12) United States Patent
Shimada et al.

(10) Patent No.: US 11,567,603 B2
(45) Date of Patent: Jan. 31, 2023

(54) CAPACITANCE DETECTION CIRCUIT AND INPUT DEVICE

(71) Applicant: ROHM CO., LTD., Kyoto (JP)

(72) Inventors: Yuji Shimada, Kyoto (JP); Go Harumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/211,204

(22) Filed: Mar. 24, 2021

(65) Prior Publication Data

US 2021/0303098 A1 Sep. 30, 2021

(30) Foreign Application Priority Data

Mar. 27, 2020 (JP) .............................. JP2020-057687

(51) Int. Cl.
*G06F 3/041* (2006.01)
*G01R 27/26* (2006.01)
*G06F 3/044* (2006.01)

(52) U.S. Cl.
CPC ....... *G06F 3/0416* (2013.01); *G01R 27/2605* (2013.01); *G06F 3/044* (2013.01)

(58) Field of Classification Search
None
See application file for complete search history.

(56) References Cited

U.S. PATENT DOCUMENTS

2017/0300148 A1* 10/2017 Shimada ............ G06F 3/041662
2020/0033979 A1* 1/2020 Sauer .................... G06F 3/0418

FOREIGN PATENT DOCUMENTS

JP 2017111507 A 6/2017

* cited by examiner

*Primary Examiner* — Stephen T. Reed
(74) *Attorney, Agent, or Firm* — Cantor Colburn LLP

(57) ABSTRACT

A capacitance detection circuit that is capable of reducing the influence of an environmental variation such as temperature. The capacitance detection circuit detects an electrostatic capacitance of a sensor electrode. A sense pin is connected to the sensor electrode. An analog front end circuit converts the electrostatic capacitance of the sensor electrode to an electrical signal, wherein an input-output characteristic of the analog front end circuit is variable. A controller adjusts the input-output characteristic of the analog front end circuit according to the environmental variation.

14 Claims, 15 Drawing Sheets

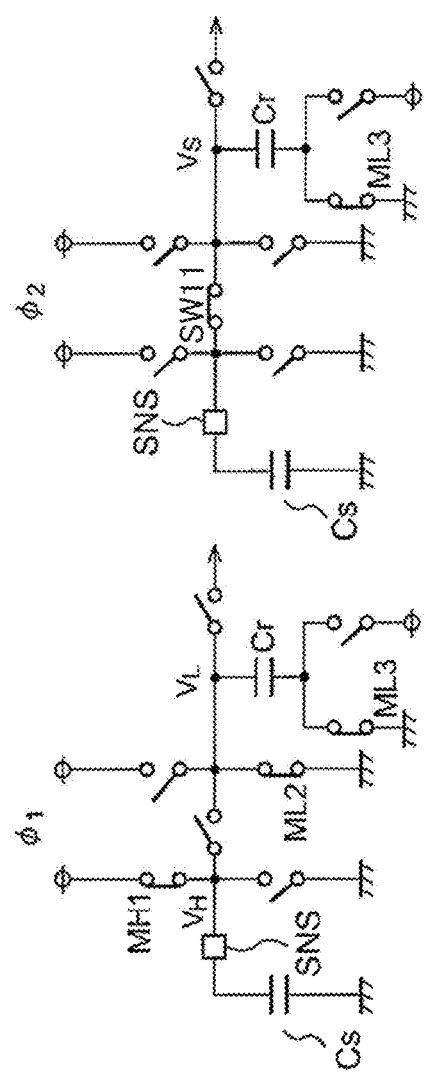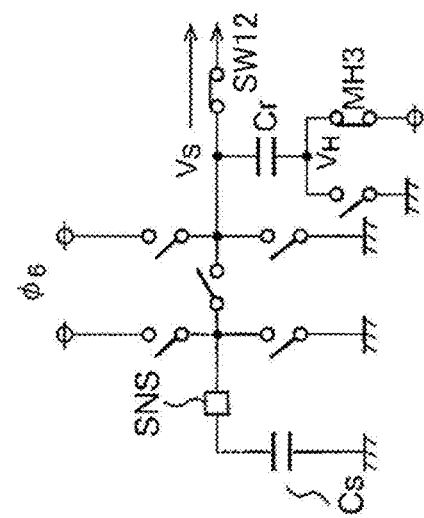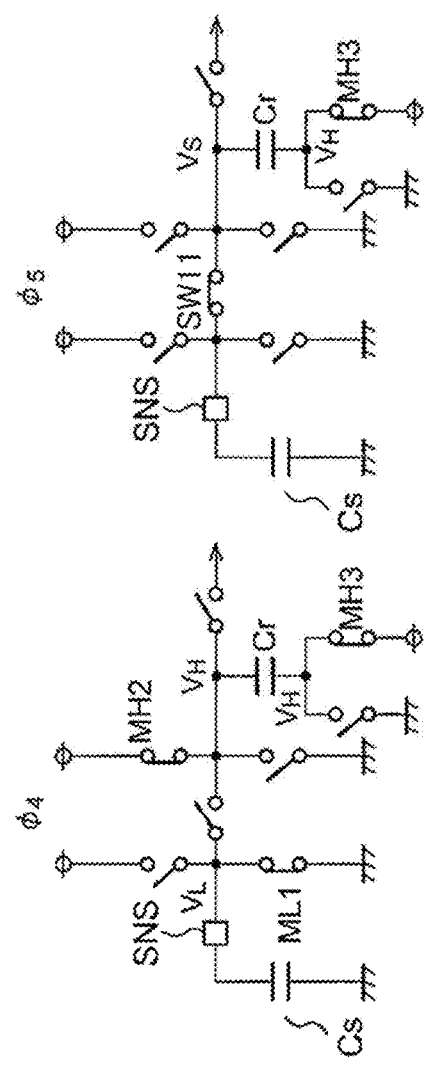

CAPACITANCE DETECTION CIRCUIT AND INPUT DEVICE

CROSS REFERENCE TO RELATED APPLICATIONS

The present invention claims priority under 35 U.S.C. § 119 to Japanese Patent Application No. 2020-057687 filed on Mar. 27, 2020, the entire content of which is incorporated herein by reference.

BACKGROUND FIELD

The field relates to a capacitance detection circuit for an electrostatic capacitance.

DESCRIPTION OF THE PRIOR ART

In recent years, touch type input devices are provided in electronic devices such as computers, smartphones, tablet terminals and portable audio devices to serve as user interfaces. Known touch type input devices include touchpads and pointing apparatuses that perform various inputs by contacting or approaching of a finger or a stylus.

Touch type input devices are substantially divided into resistive film type and electrostatic capacitance type. In the electrostatic capacitance type, a plurality of sensor electrodes convert variation of electrostatic capacitances (referred to as a capacitance below) generated by a user input to electrical signals so as to detect the presence or absence of a user input and coordinates position thereof.

Methods for detecting the electrostatic capacitance are substantially divided into self-capacitance type and mutual capacitance type. The self-capacitance type has extremely high sensitivity, and is capable of detecting touching operation as well as finger approach. However, the self-capacitance type suffers issues of being incapable of distinguishing waterdrops from touching or detecting a two-point touch. On the other hand, the mutual capacitance type features advantages of capabilities for detecting a two-point touch (or a multi-point touch of more than two points), and is less likely affected by waterdrops. Thus, either one or both of the self-capacitance type and the mutual capacitance type can be selected according to an intended purpose.

PRIOR ART DOCUMENTS

Patent Documents

[Patent document 1] Japan Patent Publication No. 2017-111507

SUMMARY

A film formed with a sensor electrode may expand or contract based on temperature, thus the electrostatic capacitance formed by the sensor electrode also changes in accordance with the temperature. Besides the temperature, the electrostatic may also change along with humidity.

An example embodiment provides a capacitance detection circuit capable from reducing influences of an environmental variation such as the temperature.

An embodiment of a capacitance detection circuit detects an electrostatic capacitance of a sensor electrode. The capacitance detection circuit includes: a sense pin, connected to the sensor electrode; an analog front end circuit, configured to convert an electrostatic of the sensor electrode to an electrical signal, wherein an input-output characteristic of the analog front end circuit is variable; an analog-to-digital converter (ADC), configured to convert an output signal of the analog front end circuit to a digital value; and a controller, configured to adjust the input-output characteristic of the analog front end circuit according to an environmental variation.

Moreover, any combination from the constituents above or any expression of the present invention as a conversion between methods and devices is also effective as a form of the present invention.

According to the present disclosure, capacitance detection capable of reducing influences of an environmental variation can be performed.

BRIEF DESCRIPTION OF THE DRAWINGS

FIG. 9A to FIG. 9F are equivalent circuit diagrams of an analog front end circuit in a first phase $\phi_1$ to a sixth phase $\phi_6$;

DETAILED DESCRIPTION OF THE EMBODIMENTS

Figure 1:
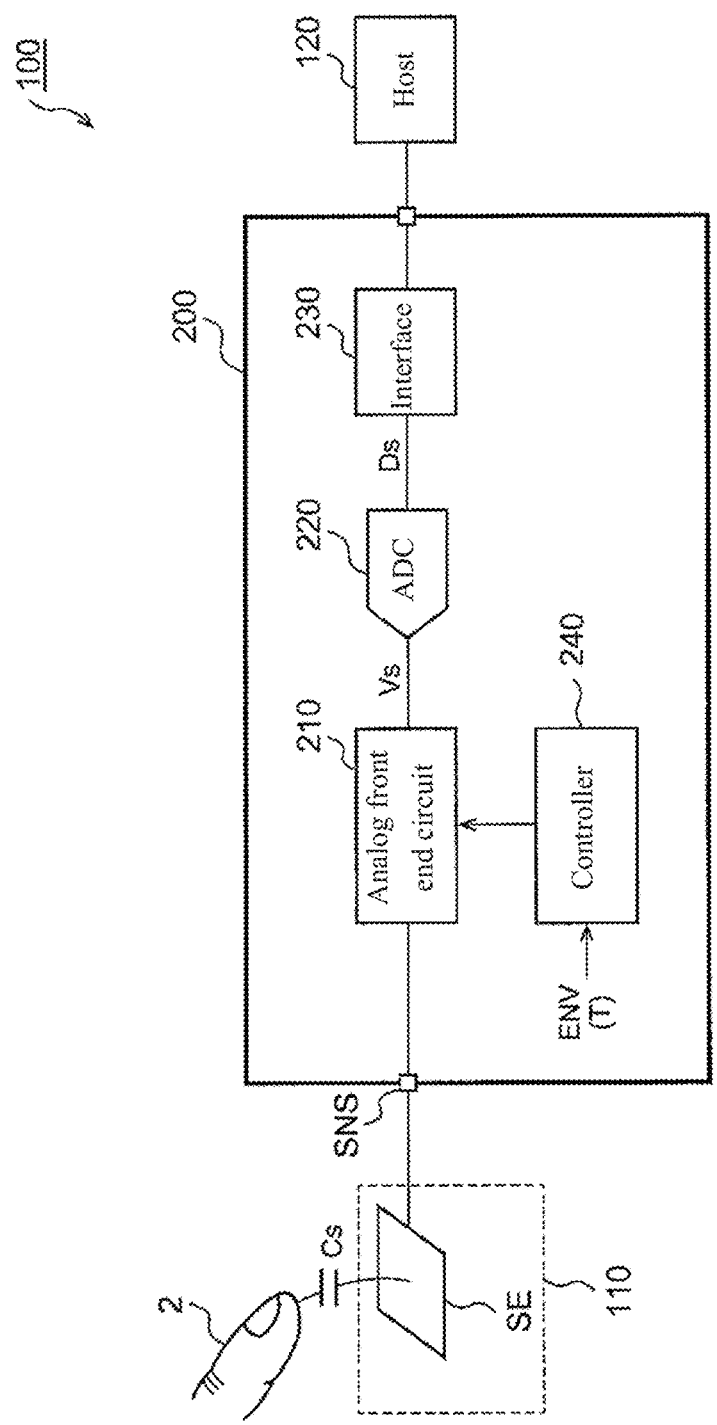
FIG. 1 shows a block diagram of a touch type input device including a capacitance detection circuit according to an embodiment of the present disclosure.

One or more aspects of the present invention are described with reference to the following description and the accompanying drawings, wherein like reference numerals are generally utilized to refer to like elements throughout, and wherein the various structures are not necessarily drawn to scale. These are indicative, however, of but a few of the various ways in which the principles of the invention may be employed. Other objects, advantages and novel features of the invention will become apparent from the following detailed description of the invention when considered in conjunction with the drawings. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are shown in block diagram or not shown in detail to avoid obscuring the invention. The present invention is not limited by the illustrated ordering of acts or events, as some acts may occur in different orders and/or concurrently with other acts or events. Further, not all illustrated acts or events are required to implement a methodology in accordance with the present invention.

In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. While a particular feature of the invention may have been disclosed with respect to only one of several aspects of the implementations, such feature may be combined with one or more other features of other implementations as may be desired and advantageous for any given or particular application.

A film formed with a sensor electrode may undesirably expand or contract based on temperature, thus the electrostatic capacitance formed by the sensor electrode also undesirably changes in accordance with the temperature. Besides changing with the temperature, the electrostatic capacitance may also undesirably change along with humidity.

An embodiment of an improved capacitance detection circuit described in this specification detects an electrostatic capacitance of a sensor electrode. An example embodiment provides a capacitance detection circuit capable of reducing the influence of an environmental variation such as the temperature. An embodiment of the capacitance detection circuit includes: a sense pin, connected to the sensor electrode; an analog front end circuit, configured to convert an electrostatic capacitance of the sensor electrode to an electrical signal, wherein an input-output characteristic of the analog circuit is variable; an analog-to-digital converter (ADC), configured to convert an output signal of the analog circuit to a digital value; and a controller, configured to adjust the input-output characteristic of the analog circuit according to an environmental variation.

By adjusting the input-output characteristic of the analog front end circuit, influences of the environmental variation can be suppressed or reduced.

The environmental variation can be a temperature variation, for example.

The capacitance detection circuit can further include a temperature sensor, and the controller is configured to control the analog front end circuit based on an output of the temperature sensor.

The controller can also control the analog front end circuit according to an external temperature information inputted from the exterior.

The controller can also detect the environmental variation according to an output of the ADC. By monitoring a drift of a baseline of the output of the ADC, the environmental variation can be indirectly detected and reflected to the control on the input-output characteristic of the analog front end circuit.

The analog front end circuit can include a reference capacitor, and a switch group including multiple switches. A switch may be implemented as a transistor switch, mechanical switch, or other switch. The electrostatic capacitance can be converted to a voltage signal by transmitting electrical charges between the reference capacitor and the sensor electrode.

The analog front end circuit can also include a compensation capacitor. A first terminal of the compensation capacitor is connected to an input of the ADC, and a second terminal is driven by a high voltage and a low voltage. The compensation capacitor has a variable capacitance. The controller can adjust the capacitance of the compensation capacitor according to the environmental variation. The input-output characteristic of the analog front end circuit can be adjusted by the capacitance of the compensation capacitor.

The capacitance detection circuit can be integrated in a single or plural semiconductor integrated circuit. As used herein, the so-called "integrated" is defined to include a situation where all components of the circuit are formed on a single semiconductor substrate, and a situation where main components of the circuit are integrated, while having a portion of resistors and/or capacitors can be configured on the outside of the semiconductor substrate for adjusting a circuit constant. By integrating the circuit on one chip, the circuit area can be reduced, and characteristics of the circuit elements can be kept uniform.

The improved capacitance detection circuit is described by way of appropriate embodiments with the accompanying drawings below. The same symbols and denotations are assigned to the same or equivalent constituents, components and processes in the drawings, and repeated description is appropriately omitted. Furthermore, the embodiments are merely illustrative and exemplary, and are not to be construed as limitations. Further, not all features and combinations thereof stated in the embodiments are necessarily essentials.

In the detailed description, as used herein, the term "connected" as used to describe the situation of "a state in which component A is connected to component B" is defined to include a situation where component A is physically and directly connected to component B, and a situation where component A is indirectly connected to component B via other components without producing substantive influences on the electrical connection state of said components, or without damaging functions or effects achieved by the combinations of said components.

Similarly, as used herein, the term "disposed" as used to describe the situation of "a state in which component C is disposed between component A and component B" is defined to include a situation where component A and component C or component B and component C are directly connected, and a situation of indirect connection via other components without producing substantive influences on the electrical connection state of said components, or without damaging functions or effects achieved by the combinations of said components.

FIG. 1 shows a block diagram of a touch type input device 100 including a capacitance detection circuit 200 according to an embodiment. The touch type input device 100 includes a panel 110 and the capacitance detection circuit 200. The touch type input device 100 is a user interface for detecting a touch operation performed by a finger 2 or a stylus of a user.

The panel 110 is a touch panel or a switch panel, and includes one or more sensor electrodes SE.

A host processor 120 integrally controls machines, apparatuses and systems disposed with the touch type input device 100. The capacitance detection circuit 200 detects an electrostatic capacitance of each sensor electrode SE, and transmits them to the host processor 120. Furthermore, the capacitance detection circuit 200 can compare an electrostatic capacitance Cs detected with a threshold value to detect the presence or absence of a touch and transmit the presence or absence of the touch to the host processor 120.

The capacitance detection circuit 200 includes a sense pin SNS, an analog front endcircuit 210, an analog-to-digital converter (ADC) 220, an interface circuit 230 and a controller 240. FIG. 1 shows a circuit configuration of one channel corresponding to one sensor electrode SE. The capacitance detection circuit 200 capable of detecting the capacitances of multiple sensor electrodes SE includes multiple sense pins SNS and multiple analog front end circuits 210 corresponding to the multiple sense pins. The ADC 220 may be configured in each channel, or be shared by multiple channels.

The sensor electrode SE is connected to the sense pin SNS. The analog front end circuit 210 is a capacitance-to-voltage converter (CVC) circuit that is coupled to the sense pin SNS and converts the electrostatic capacitance Cs formed by the sensor electrode SE to a voltage signal Vs. The ADC 220 is coupled to the output of the analog circuit 210 and converts the voltage signal Vs to a digital signal Ds. The interface circuit 230 is coupled to the ADC 220 and transmits the digital signal Ds to the host processor 120.

The analog front endcircuit 210 is configured such that an input-output characteristic of the analog front end circuit 210, that is, a relationship between the electrostatic capacitance Cs as the input and the voltage signal Vs as the output, is variable. Assuming that the input-output characteristic is linear, the following equation is established, wherein the input-output characteristic is expressed by a combination of two constants $V_0$ and $\alpha$.

$$V_s = V_0 + \alpha \cdot Cs$$

In this case, the analog front end circuit 210 is configured such that at least one of $V_0$ and $\alpha$ is variable.

The controller 240 adjusts the input-output characteristic of the analog front endcircuit 210 according to a variation in an environment ENV. The environment ENV monitored by the controller 240 is preferably, for example, temperature.

Figure 2A:
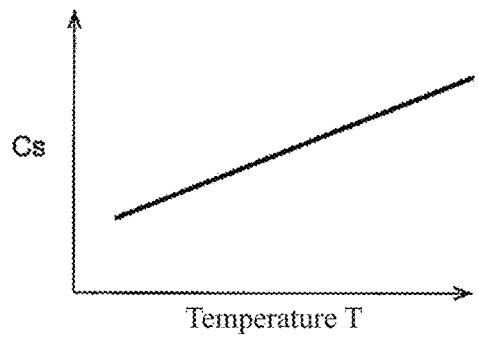
FIG. 2A to FIG. 2C are diagrams for illustrating the operation of the touch type input device of FIG. 1.
Figure 2B:
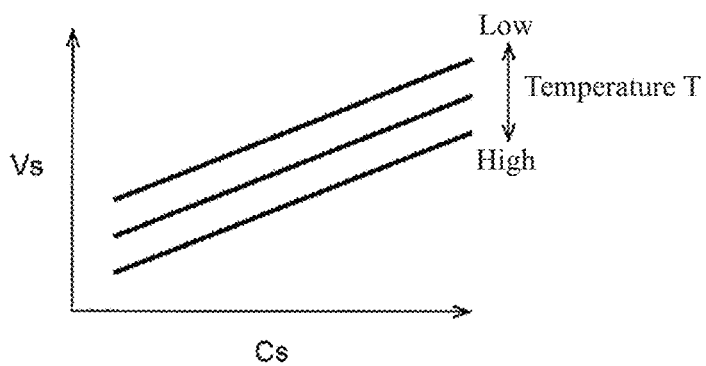
Figure 2C:
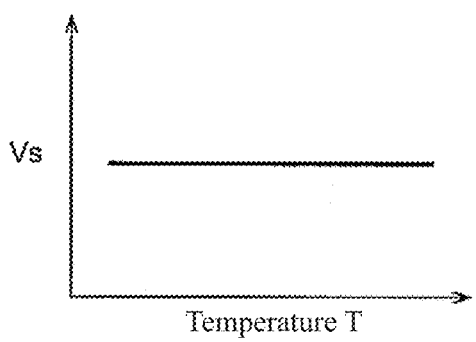

FIG. 2A to FIG. 2C show diagrams of the operation of an example of a touch type input device 100 in FIG. 1. FIG. 2A shows characteristics of the panel 110, i.e., a diagram of the relationship between the temperature and the electrostatic capacitance Cs under untouched situation. FIG. 2B shows a diagram of the input-output characteristic of the analog front end circuit 210, wherein the input-output characteristic changes according to the temperature T. FIG. 2C shows a diagram of the relationship between the temperature T and the detection signal Vs, wherein the change of the detection signal Vs caused by the temperature T is suppressed.

The operation of the touch type input device 100 is as described above. According to the touch type input device 100, influences of the change in the electrostatic capacitance Cs caused by the temperature variation can be eliminated or reduced significantly, and a touch can be accurately detected.

In another method for eliminating the influences of temperature, an approach (to be referred to as a comparison technique) of eliminating, at a back end compared to the ADC 220 by digital signal processing, the influences of the temperature variation can be considered. The advantages of the embodiments with respect to the comparison technique are described below.

Figure 3A:
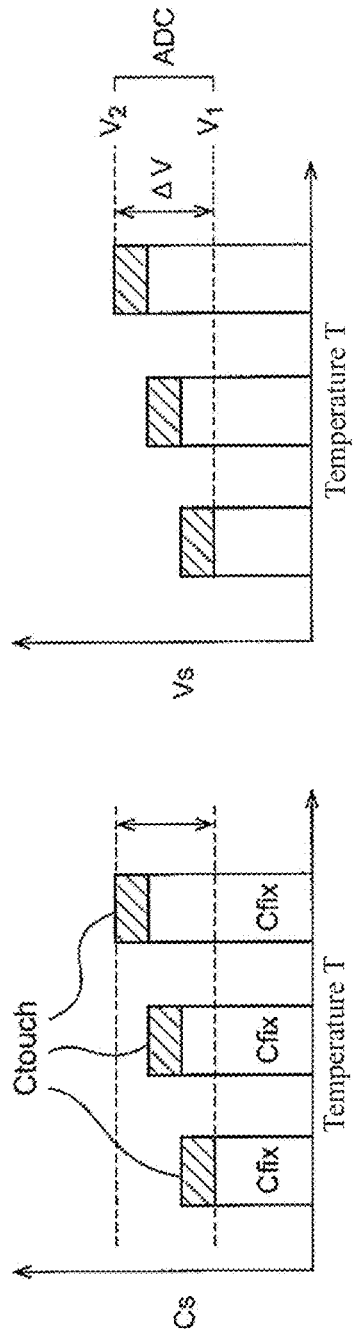
FIG. 3A and FIG. 3B are diagrams of illustrating differences in the operations of a comparative embodiment and an embodiment of the present disclosure.
Figure 3B:
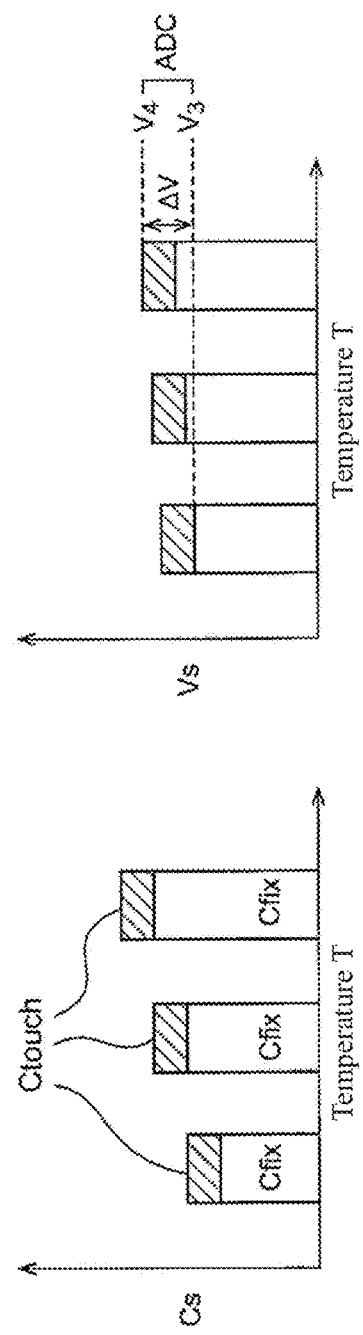

FIG. 3A and FIG. 3B show diagrams of differences in the operations of the comparative and the embodiment of the present disclosure. The relationship between the temperature T and the electrostatic capacitance Cs is indicated on the left of each diagram. The electrostatic capacitance Cs includes a portion Cfix that is not dependent on a touch, and a portion Ctouch (shaded parts) caused by a touch. In this example, the change dependent on the temperature T is from the portion Cfix that is not dependent on (i.e. independent from) a touch, and in this situation, it should be understood that the coefficient $\alpha$ in the equation is not dependent on the temperature T, but only the offset amount $V_0$ is dependent on the temperature T. Thus, the analog front endcircuit 210 is configured such that the offset amount $V_0$ can drift according to the temperature.

In the comparative embodiment, as shown in FIG. 3A, the electrostatic capacitance Cs is directly converted to the voltage signal Vs. In this case, in order to detect the presence or absence of a touch within all temperature ranges, the input voltage range of the ADC needs to be designed as covering $V_1$ to $V_2$.

On the other hand, in the embodiment of the improved capacitance detecting circuit, as shown in FIG. 3B, the variation range of the voltage signal Vs in various temperature values can be kept uniform by compensating the input-output characteristic of the analog front end circuit 210. In order to detect the presence or absence of a touch within all temperature ranges, the input voltage range of the ADC needs to be designed to cover the range between $V_3$ to $V_4$.

A voltage range $\Delta V$ to be monitored by the ADC in the embodiment is less than a voltage range $\Delta V$ to be monitored by the ADC in the comparative embodiment. Under the situation of gradation of an ADC being the same, this embodiment of the present disclosure may be capable to enhance the detection sensitivity of the electrostatic capacitance Cs.

Various devices and methods may be understood by the form of the block diagram or circuit diagram in FIG. 1 or derived from the description, and is not limited to a specific configuration. More specific configuration examples or embodiments are described below, not to restrain the scope of the present invention but to provide an explanation of an example of the improved capacitance detection circuit.

Figure 4A:
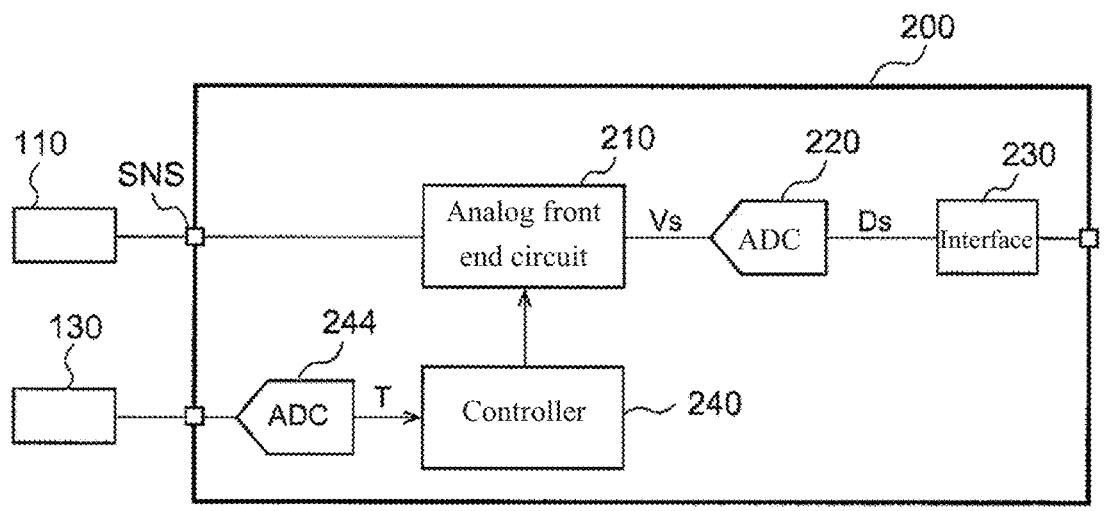
FIG. 4A to FIG. 4C are circuit diagrams showing an example of a configuration of a capacitance detection circuit.
Figure 4B:
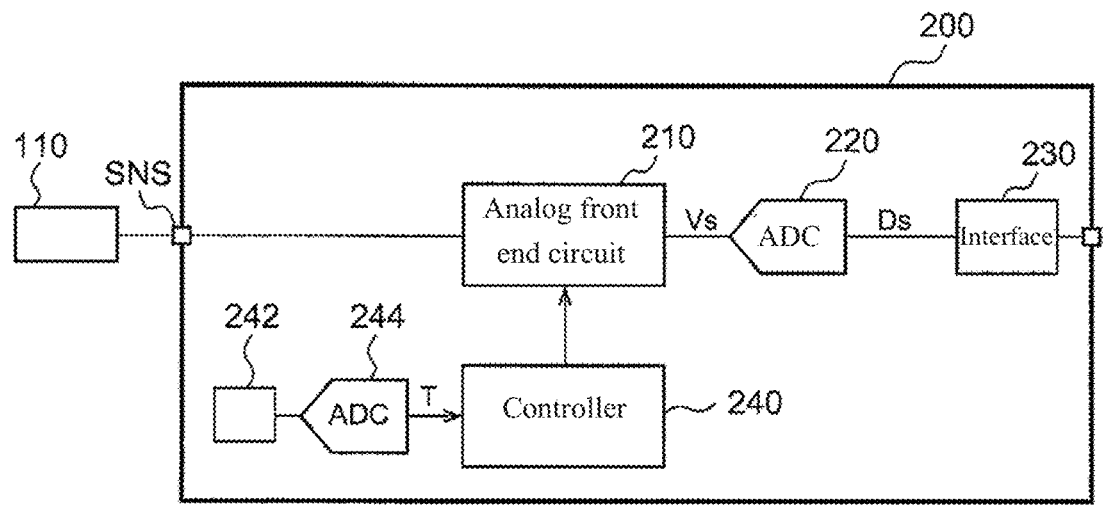
Figure 4C:
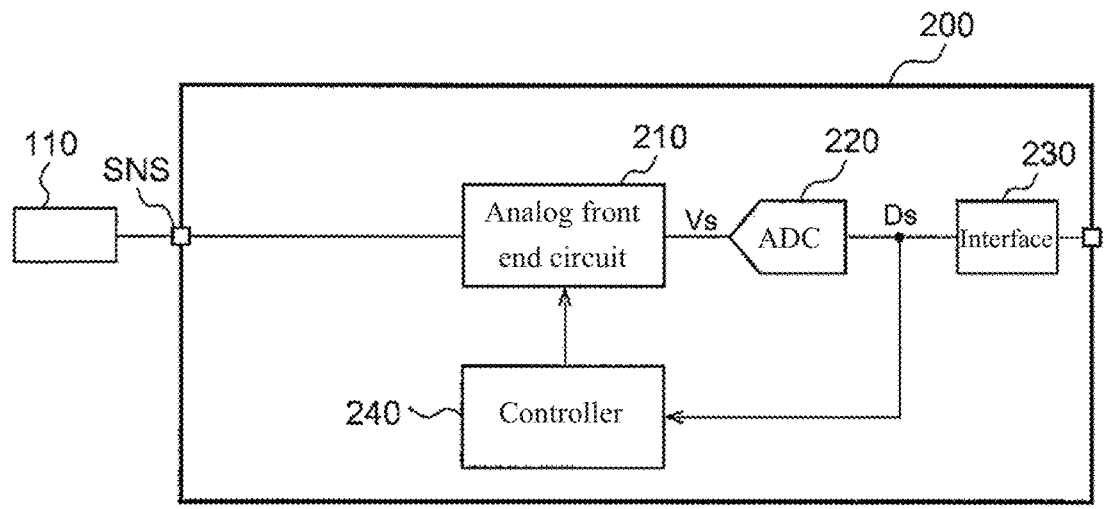

FIG. 4A to FIG. 4C show circuit diagrams of a configuration example of the capacitance detection circuit 200. In FIG. 4A, a temperature sensor 130 is configured at an external side of (i.e. outside) the capacitance detection circuit 200. The temperature sensor 130 can be disposed in the proximity of the panel 110, or may be disposed in the proximity of a heat source (e.g., a battery, or a circuit constituting another heat source) causing a temperature variation of the panel 110. A thermistor or a thermocouple can be utilized as the temperature sensor 130. An ADC 244 converts an output of the temperature sensor 130 to a digital signal which is used as temperature information T provided to the controller 240.

In FIG. 4B, the capacitance detection circuit 200 is built-in with a temperature sensor 242. The ADC 244 converts an output of the temperature sensor 242 to a digital signal as temperature information T that is provided to the controller 240.

In FIG. 4C, the controller 240 detects the temperature variation according to an output Ds of the ADC 220. When the temperature T rises, the output Ds of the ADC 220 remains around an upper limit; when the temperature T drops, the output Ds of the ADC 220 remains around a lower limit. Thus, by monitoring a baseline of the output Ds of the ADC 220, a drift in the temperature T can be detected. When the baseline of the digital signal Ds remains around the lower limit, the controller 240 determines that the temperature T has dropped, and compensates the input-output characteristic of the analog front endcircuit 210. Conversely, when the baseline of the digital signal Ds remains around the upper limit, the controller 240 determines that the temperature T has increased, and compensates the input-output characteristic of the analog front end circuit 210.

Figure 5:
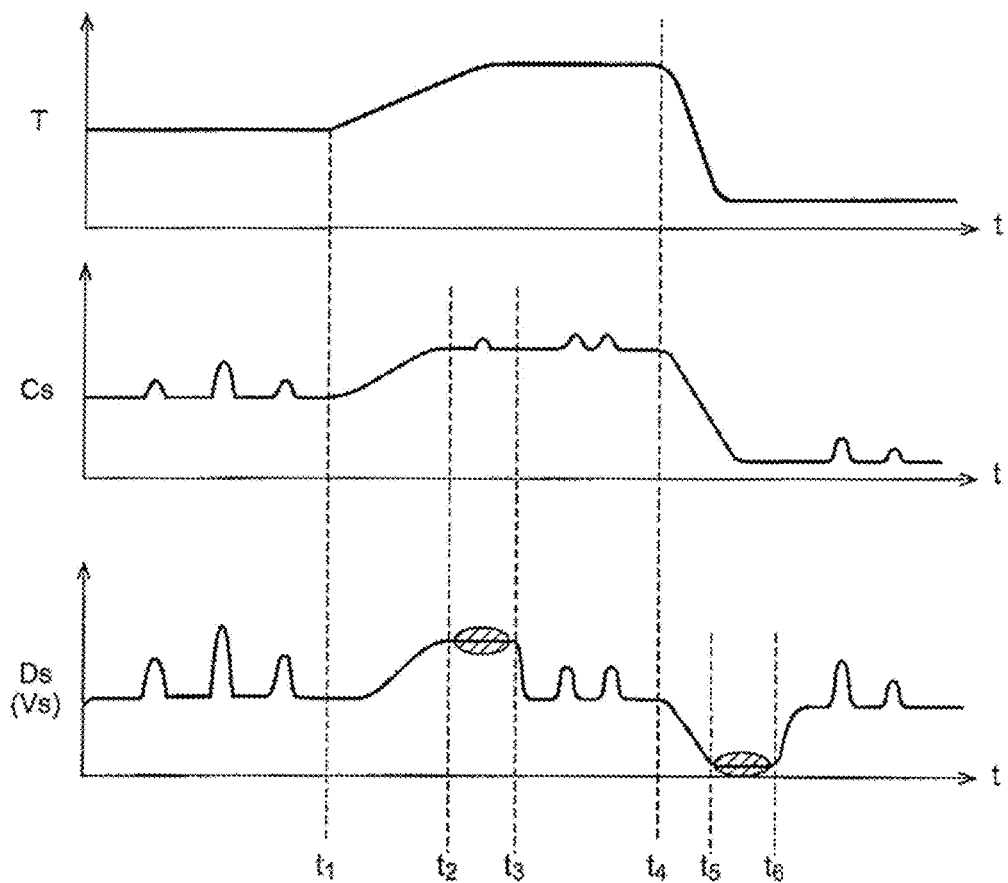
FIG. 5 is a diagram for illustrating the operation of the capacitance detection circuit in FIG. 4C.

FIG. 5 shows a diagram of the operation of the capacitance detection circuit 200 in FIG. 4C. Waveforms of the temperature T, the electrostatic capacitance Cs and the digital signal Ds (the voltage signal Vs) are depicted in FIG. 5. Before a timing $t_1$, the temperature T is stable, and the input-output characteristic of the analog front end circuit 210 is optimized with respect to the temperature T.

After the timing $t_1$, the temperature T starts to rise, and accordingly the electrostatic capacitance Cs and the digital signal Ds also rises. Then, the baseline of the digital signal Ds remains around the upper limit. In this state, the change in the electrostatic capacitance Cs cannot be detected. Upon detecting remaining within specified timings $t_2$ to $t_3$, the controller 240 determines that the temperature has increased, and switches the input-output characteristic of the analog front end circuit 210.

When the input-output characteristic of the analog front endcircuit 210 is switched at the timing $t_3$, the baseline of the digital signal Ds shifts downward. Accordingly, the change in the electrostatic capacitance Cs can be detected.

After the timing $t_4$, the temperature T starts to drop, and accordingly the electrostatic capacitance Cs decreases and the digital signal Ds also drops. Then, the baseline of the digital signal Ds remains around the lower limit. In this state, the change in the electrostatic capacitance Cs cannot be detected. Upon detecting remaining within specified timings $t_5$ to $t_6$, the controller 240 determines that the temperature has dropped, and switches the input-output characteristic of the analog front end circuit 210.

When the input-output characteristic of the analog front end circuit 210 is switched at the timing $t_6$, the baseline of the digital signal Ds shifts upward. Accordingly, the change in the electrostatic capacitance Cs can be detected.

Figure 6:
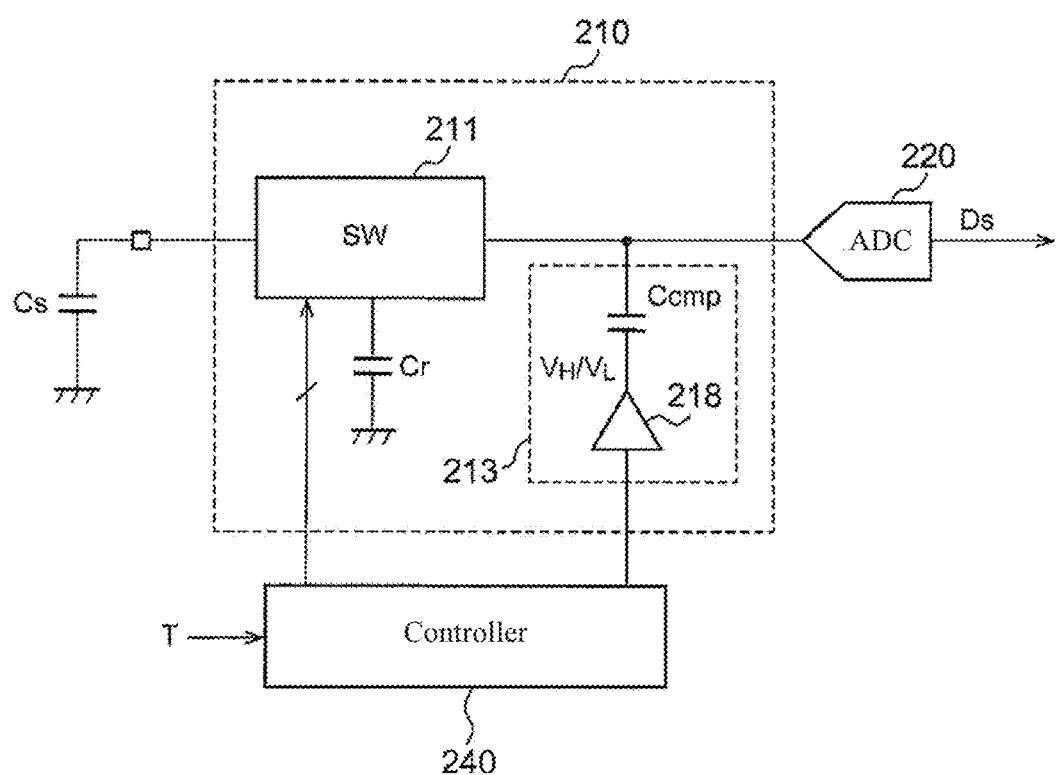
FIG. 6 is a circuit diagram of an example of a fundamental configuration of an analog front end circuit.

A configuration example of the analog front end circuit 210 is further described below. FIG. 6 shows an example with a circuit diagram of a configuration of the analog front end circuit 210.

The analog front end circuit 210 includes a reference capacitor Cr, a switch group 211 and a compensation capacitor Ccmp. The controller 240 transmits electrical charges between the sensor electrode SE and the reference capacitor Cr by controlling the switch group 211, so as to detect the electrostatic capacitance Cs of the sensor electrode SE.

The analog front end circuit 210 can also operate in three states—a charging phase, a transmission phase and a sampling phase. In the charging phase, at least one of the electrostatic capacitance Cs or the reference capacitor Cr is charged by a predetermined voltage. Next, in the transmission phase, the electrostatic capacitance Cs is connected to the reference capacitor Cr, and electrical charges are transmitted therebetween. As a result, an amount of electrical charges corresponding to the electrostatic capacitance Cs is stored in the reference capacitor Cr. In the sampling phase, the voltage signal Vs based on the amount of electrical charges of the reference capacitor Cr is supplied to the back-end ADC 220.

However, it should be noted the configuration of the analog front endcircuit 210 (the CVC) is not specifically limited to the example details shown in FIG. 6.

A compensation circuit 213 is provided for the purpose of controlling the input-output characteristic of the analog front end circuit 210. The compensation circuit 213 includes a compensation capacitor Ccmp and a driving unit 218. The first terminal of the compensation capacitor Ccmp is connected to the input of the ADC 220. The driving unit 218 applies a high-level voltage $V_H$ and a low-level voltage $V_L$ to the second terminal of the compensation capacitor Ccmp.

The compensation capacitor Ccmp is a variable capacitor, and the controller 240 sets the capacitance of the compensation capacitor Ccmp according to environmental information such as the temperature T. For example, the controller 240 stores a table representing the correspondence between the temperature T and the capacitance value of the compensation capacitor Ccmp, and the capacitance of the compensation capacitor Ccmp is set with reference to the table.

With such configuration, the offset voltage $V_O$ of the input-output characteristic can be adjusted by controlling the capacitance value of the compensation capacitor Ccmp.

An example of implementing the analog front endcircuit 210 is subsequently described.

Figure 7:
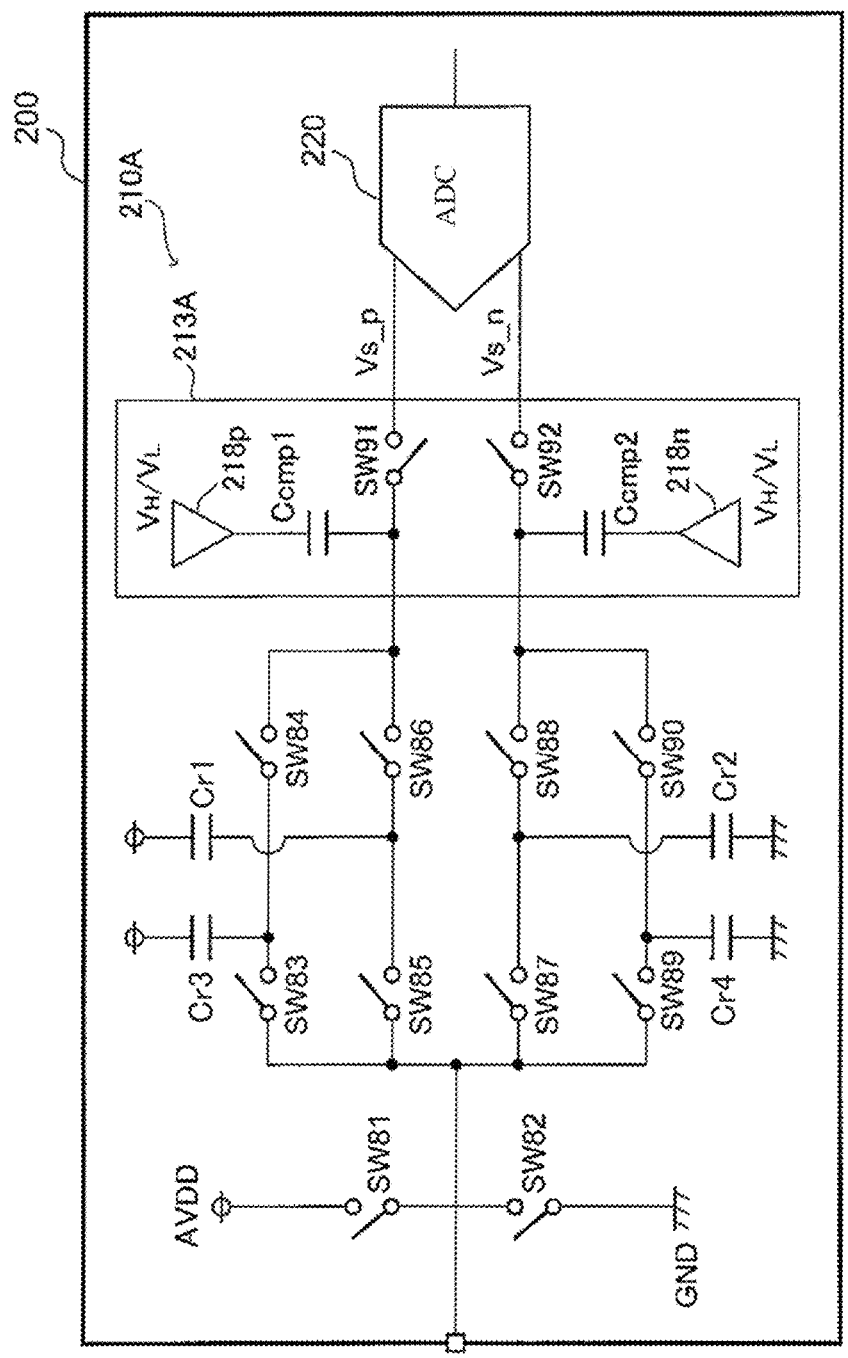
FIG. 7 is a circuit diagram of an analog front end circuit according to a first embodiment.

FIG. 7 shows a circuit diagram of an analog front end circuit 210A according to a first embodiment. The analog front end circuit 210A includes multiple switches SW81 to SW90, four reference capacitors Cr1 to Cr4, an ADC 220 and a compensation circuit 213A. The electrostatic capacitance Cs is converted to differential voltage signals Vs_p and Vs_n by the multiple switches SW81 to SW90 and the four reference capacitors Cr1 to Cr4, and converted to a digital signal by the ADC 220.

The compensation circuit 213A includes compensation capacitors Ccmp1 and Ccmp2, switches SW91 and SW92, driving units 218$p$ and 218$n$. The compensation capacitors Ccmp1 and Ccmp2 are variable capacitors, and capacitance values thereof are set according to the temperature. The controller 240 is in synchronization with the sensing operation of the analog front endcircuit 210, and controls the driving units 218$p$ and 218$n$ to apply the high voltage $V_H$ or the low voltage $V_L$ on one terminal of each of the compensation capacitors Ccmp1 and Ccmp2. Accordingly, the sensing voltages Vs_p and Vs_n of inputted to the ADC 220 can be shifted (offset or compensated) in accordance with the capacitance value of the compensation capacitors Ccmp1 and Ccmp2.

Figure 8:
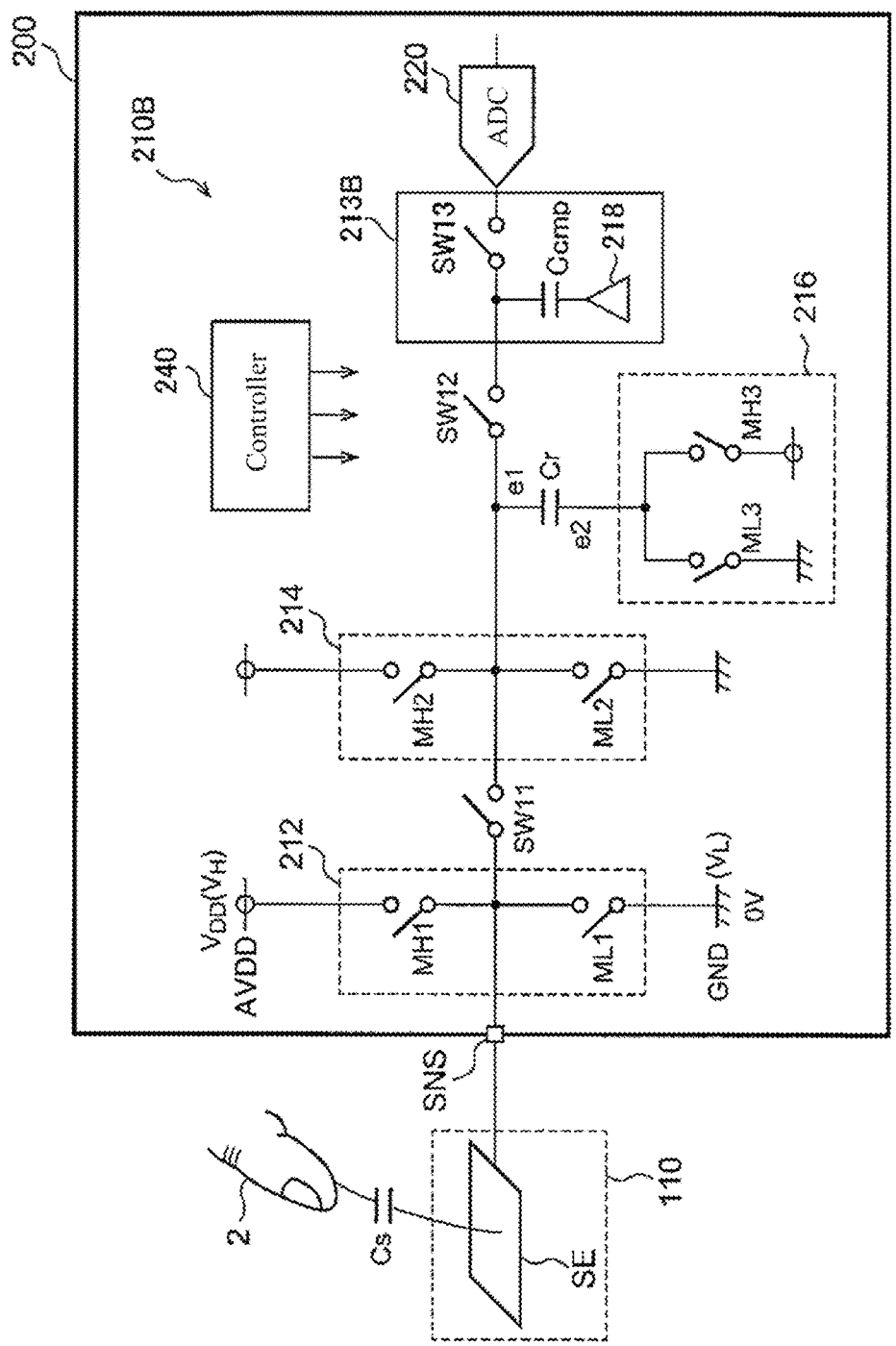
FIG. 8 is a circuit diagram of an analog front end circuit according to a second embodiment.

FIG. 8 shows a circuit diagram of an analog front end circuit 210B according to a second embodiment. The analog front end circuit 210B includes a first driving unit 212, a second driving unit 214, a third driving unit 216, a first switch SW11, a second switch SW12, a reference capacitor Cr and a compensation circuit 213B.

The first driving unit 212 applies a high voltage $V_H$ or a low voltage $V_L$ to the sense pin SNS. For example, the high voltage $V_H$ is a power voltage $V_{DD}$ of a power line AVDD, and the low voltage $V_L$ is a ground voltage $V_{GND}$ (=0 V) of a ground line GND.

The second driving unit 214 applies the high voltage $V_H$ or the low voltage $V_L$ to a first terminal e1 of the reference capacitor Cr.

The third driving unit 216 applies the high voltage $V_H$ or the low voltage $V_L$ to a second terminal e2 of the reference capacitor Cr.

Each of the first driving unit 212, the second driving unit 214 and the third driving unit 216 includes a high-side switch MH and a low-side switch ML.

The first switch SW11 is disposed between the sense pin SNS and the first terminal e1 of the reference capacitor Cr. The second switch SW12 is disposed between the input of the back-end ADC 220 and the first terminal e1 of the reference capacitor Cr.

The controller 240 controls the first driving unit 212, the second driving unit 214, the third driving unit 216, the driving unit 218 and the first switch SW11 to the third switch SW13. In this embodiment, from a first phase φ1, second phase φ2 ... to a sixth phase φ6, the controller 240 switches the state of the analog front endcircuit 210B. FIGS. 9(a) to 9(f) are equivalent circuit diagrams of the analog front end circuit 210B in the first phase $\phi_1$ to the sixth phase $\phi_6$. The first phase $\phi_1$ to the third phase $\phi_3$ are the unit for one round of sensing, and the fourth phase $\phi_4$ to the sixth phase $\phi_6$ are the unit for one round of sensing. To simplify the explanation, FIGS. 9(a) to 9(f) do not illustrate the compensation circuit 213B.

As shown in FIG. 9A, in the first phase 4i, the first driving unit 212 applies the high voltage $V_H$ to the sense pin SNS, the second driving unit 214 applies the low voltage $V_L$ to the first terminal e1 of the reference capacitor Cr, and the third driving unit 216 applies the high voltage $V_H$ to the second terminal e2 of the reference capacitor Cr. At this point in time, a charge amount Qr of the reference capacitor Cr becomes 0, and a charge amount Qs of the electrostatic capacitance Cs becomes $V_H \times Cs$.

As shown in FIG. 9B, in the second phase $\phi_2$, the first switch SW11 is closed, and the third driving unit 216 applies the low voltage $V_L$ to the second terminal e2 of the reference capacitor Cr. As used in this specification, when a switch is described as "closed," it means that current may flow across the switch; a switch may include a transistor switch, mechanical switch, or other switch. In this state, transmission of electrical charges between the electrostatic capacitance Cs and the reference capacitor Cr occurs, thereby smoothing the charge amounts Qs and Qr.

$$Cs \times V_H = (Cs+Cr) \times Vs$$

At this point in time, the internal voltage Vs is represented by equation (1):

$$Vs = Cs/(Cs+Cr) \times V_H \qquad (1)$$

As shown in FIG. 9C, in the third phase $\phi_3$, the second switch SW12 is closed, and the third driving unit 216 applies the low voltage $V_L$ to the second terminal e2 of the reference capacitor Cr. Accordingly, the sensing voltage Vs is supplied to the back-end ADC 220.

As shown in FIG. 9D, in the fourth phase $\phi_4$, the first driving unit 212 applies the low voltage $V_L$ to the sense pin SNS, the second driving unit 214 applies the high voltage $V_H$ to the first terminal e1 of the reference capacitor Cr, and the third driving unit 216 applies the high voltage $V_H$ to the second terminal e2 of the reference capacitor Cr. At this point in time, the charge amount Qr of the reference capacitor Cr becomes 0, and the charge amount Qs of the electrostatic capacitance Cs becomes 0.

As shown in FIG. 9E, in the fifth phase $\phi_5$, the first switch SW11 is closed, and the third driving unit 216 applies the high voltage $V_H$ to the second terminal of the reference capacitor Cr. In this state, the internal voltage Vs is represented by equation (2):

$$Vs = Cr/(Cs \times Cr) \times V_H = V_H - Cs/(Cs+Cr) \times V_H \qquad (2)$$

As shown in FIG. 9F, in the sixth phase $\phi_6$, the second switch SW12 is closed, and the third driving unit 216 applies the high voltage $V_H$ to the second terminal e2 of the reference capacitor Cr. Accordingly, the sensing voltage Vs is supplied to the back-end ADC 220.

Figure 10:
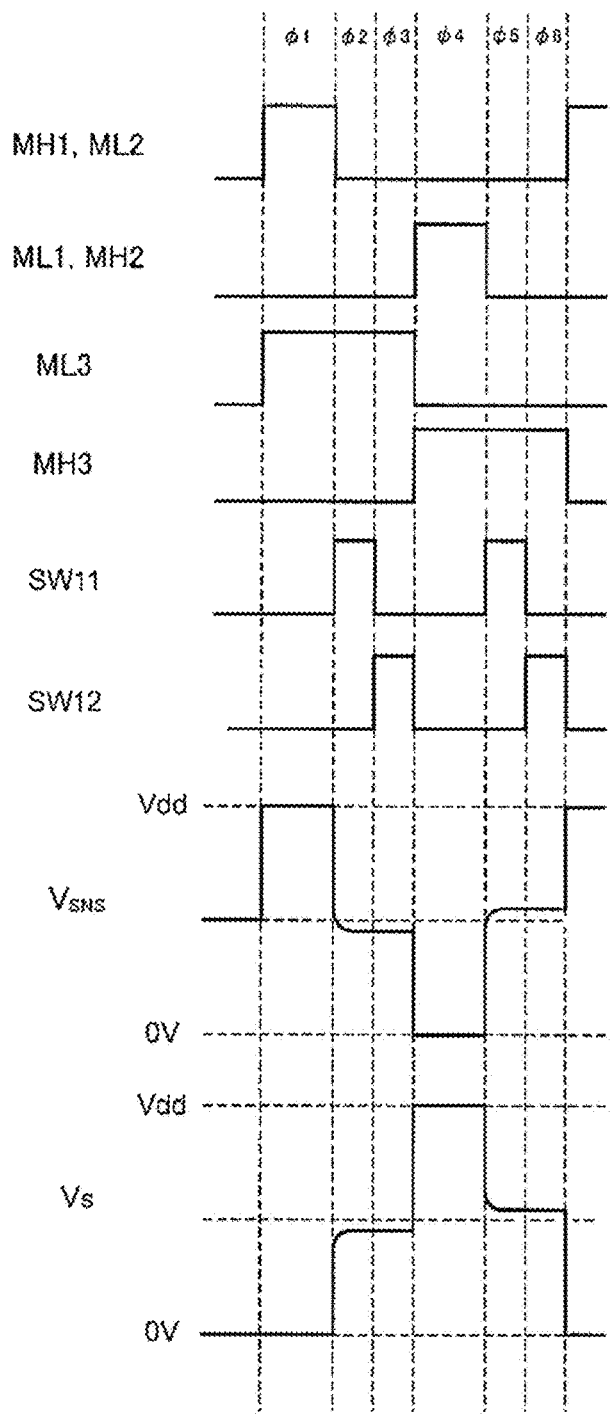
FIG. 10 is a waveform diagram of the operation of the analog front end circuit in FIG. 8.

A configuration of the analog front endcircuit 210B is described above as an example, and the operation thereof is described below. FIG. 10 shows a waveform diagram of the operation of the analog front end circuit 210B of FIG. 8. In the first phase $\phi_1$, the switch MH1 is closed, and the voltage $V_{SNS}$ of the sense pin SNS becomes the high voltage $V_H = V_{DD}$. Furthermore, the switches ML2 and ML3 are closed, and the internal voltage Vs becomes the low voltage $V_L = 0$ V. In the following second phase $\phi_2$, the first switch SW11 is closed, electrical charges are transmitted between the electrostatic capacitance Cs and the reference capacitor Cr, and the internal voltage Vs is stable at the voltage level represented by equation (1). Then, in the third phase $\phi_3$, the second switch SW12 is closed, and the internal voltage Vs is supplied to the back end.

In the fourth phase $\phi_4$, the switch ML1 is closed, and the voltage $V_{SNS}$ of the sense pin SNS becomes the low voltage $V_L = 0$ V. Furthermore, the switches MH2 and MH3 are closed, and the internal voltage Vs becomes the high voltage $V_H = V_{DD}$. In the following fifth phase $\phi_5$, the first switch SW11 is closed, and electrical charges are transmitted between the electrostatic capacitance Cs and the reference capacitor Cr, and the internal voltage Vs is stable at the voltage level represented by equation (2). Then, in the sixth phase $\phi_6$, the second switch SW12 is closed, and the internal voltage Vs is supplied to the back end.

The operation of the analog front endcircuit 210B above is described. Compared to the analog front end circuit 210A in FIG. 7, the analog front end circuit 210B can reduce the number of the reference capacitor Cr to 1, hence reducing the circuit area.

Figure 11:
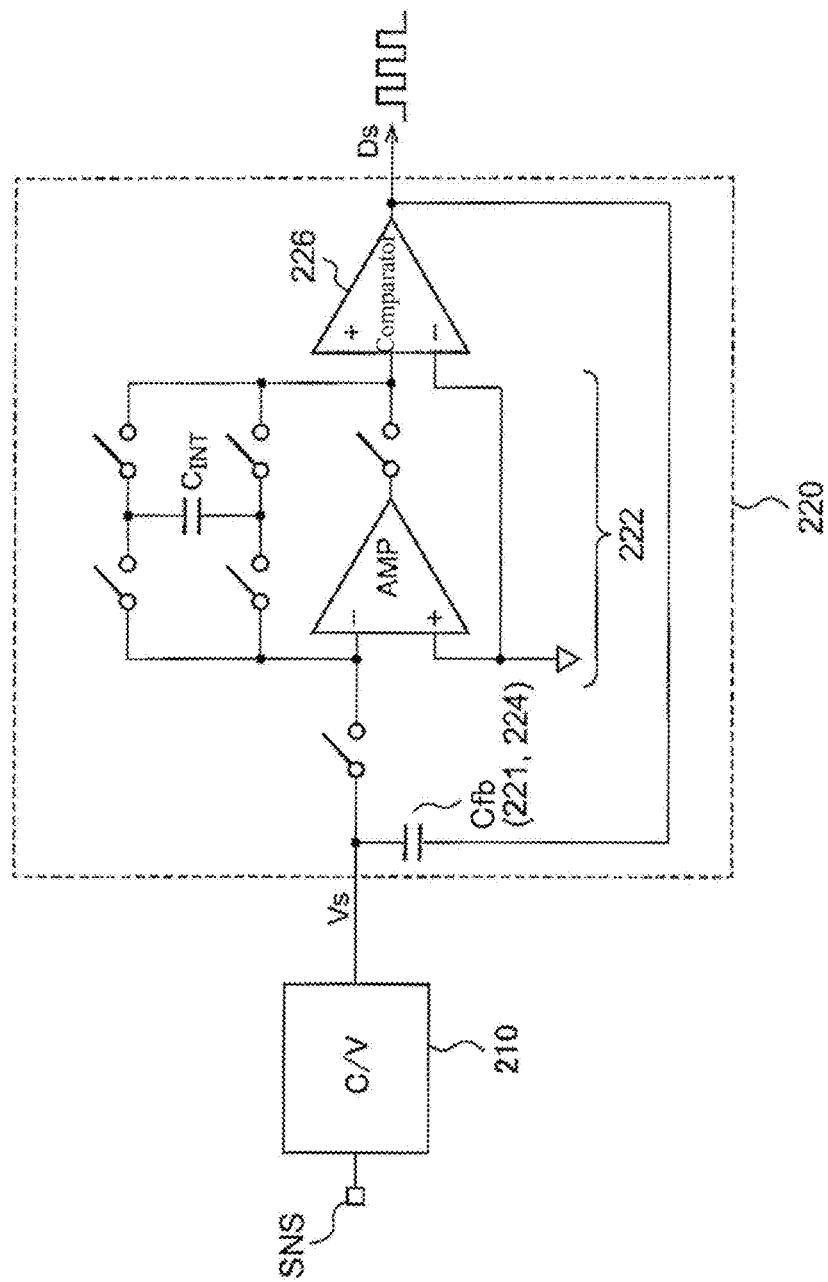
FIG. 11 is a diagram showing an example of a specific configuration of an analog-to-digital converter (ADC)

FIG. 11 shows a diagram of a specific configuration example of the ADC 220. The ADC 220 is a Delta-Sigma ΔΣ modulator, and the digital signal Ds is a bitstream obtained by oversampling.

The ΔΣ modulator usually includes a subtractor 221, an integrator 222, a comparator 223 and a digital-to-analog converter (DAC) 224. In this configuration, a capacitor Cfb serves the functions of the subtractor 221 and the DAC 224. By using the capacitor Cfb, a high voltage or a low voltage corresponding to the bitstream Ds is feedbacked to the input of the ADC 220, and a signal component equivalent to a difference to the sensing voltage Vs from the analog front endcircuit 210 is inputted to the integrator 222. The integrator 222 accumulates the difference. The comparator 226 compares an output of the integrator 222 with the reference voltage, and converts the difference to a bitstream. Four switches are provided on two terminals of a capacitor $C_{INT}$ of the integrator 222, and the polarity of the capacitor $C_{INT}$ is inverted during the periods of processing the voltage Vs obtained in the third phase $\phi_3$ and the voltage Vs obtained in the sixth phase $\phi_6$.

Furthermore, the configuration of the ADC 220 is not limited to that in FIG. 11, as ADCs in various other forms and approaches can be used.

Figure 12:
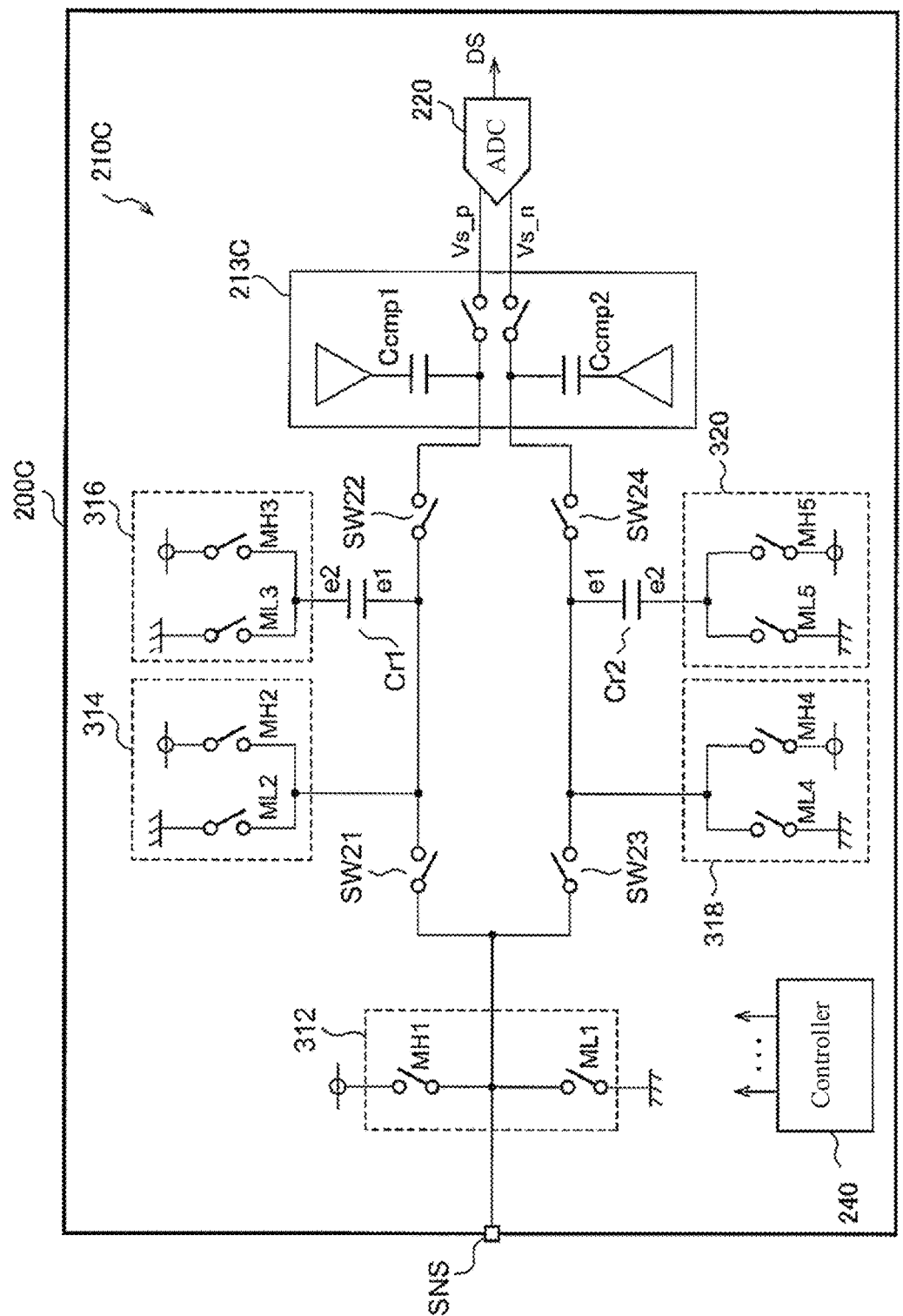
FIG. 12 is a circuit diagram of an analog front end circuit according to a third embodiment.

FIG. 12 shows a circuit diagram of an analog front endcircuit 210C according to a third embodiment. The sensor electrode SE is connected to the sense pin SNS. The analog front end circuit 210C includes a first driving unit 312, a second driving unit 314, a third driving unit 316, a fourth driving unit 318, a fifth driving unit 320, a controller 240, and a first switch SW21, a second switch SW22, a third switch SW23 and a fourth switch SW24.

The first driving unit 312 applies the high voltage $V_H$ or the low voltage $V_L$ to the sense pin SNS. The second driving unit 314 applies the high voltage $V_H$ or the low voltage $V_L$ to a first terminal e1 of a first reference capacitor Cr1. The third driving unit 316 applies the high voltage $V_H$ or the low voltage $V_L$ to a second terminal e2 of the first reference capacitor Cr1. The fourth driving unit 318 applies the high voltage $V_H$ or the low voltage $V_L$ to a first terminal e1 of a second reference capacitor Cr2. The fifth driving unit 320 applies the high voltage $V_H$ or the low voltage $V_L$ to a second terminal e2 of the second reference capacitor Cr2.

Each of the first driving unit 312 to the fifth driving unit 320 includes a high-side switch MH and a low-side switch ML. The first switch SW21 is disposed between the sense pin SNS and the first terminal e1 of the first reference capacitor Cr1. The second switch SW22 is disposed between the first input of a differential input of the ADC 220 and the first terminal e1 of the first reference capacitor Cr1.

The third switch SW23 is disposed between the sense pin SNS and the first terminal e1 of the second reference capacitor Cr2. The fourth switch SW24 is disposed between the second input of the ADC 220 and the first terminal e1 of the second reference capacitor Cr2.

The controller 240 controls the first driving unit 312, the second driving unit 314 . . . to the fifth driving unit 320, and the first switch SW21, the second switch unit SW22 . . . to the fourth switch SW24.

Furthermore, a compensation circuit 213C is provided on an output section of the analog front endcircuit 210. The configuration of the compensation circuit 213C is the same as that of the compensation circuit 213A in FIG. 7.

FIG. 13A to FIG. 13F are equivalent circuit diagrams of the analog front end circuit 210 in the first phase $\phi_1$ to the fifth phase $\phi_5$. The first phase $\phi_1$ and the second phase $\phi_2$ in FIG. 13A and FIG. 13B correspond to the first phase $\phi_1$ and the second phase $\phi_2$ in FIG. 9A and FIG. 9B, respectively. In the second phase $\phi_2$, an internal voltage Vs1 of equation (1a) is generated:

$$Vs1 = Cs/(Cs+Cr1) \times V_H \quad (1a)$$

Figure 13A:
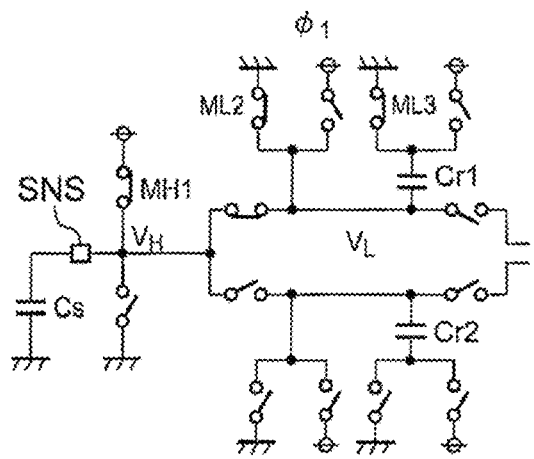
FIG. 13A to FIG. 13E are equivalent circuit diagrams showing an analog front end circuit in a first phase $\phi_1$ to a fifth phase $\phi_5$.
Figure 13B:
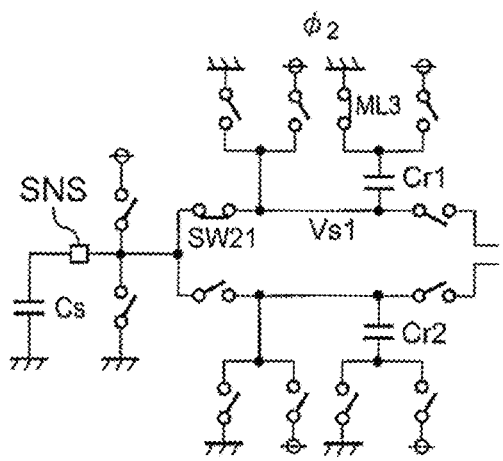
Figure 13C:
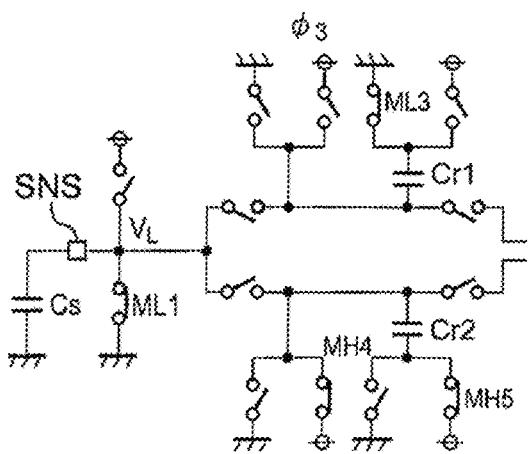
Figure 13D:
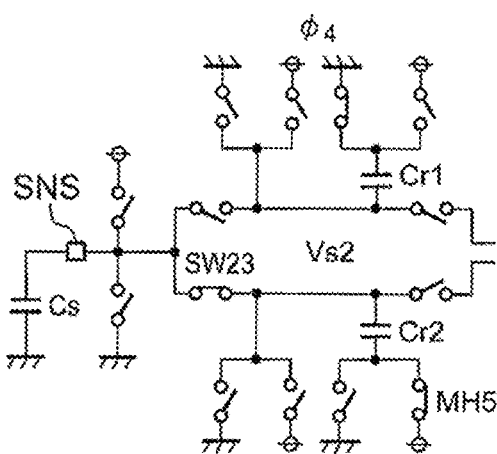

The third phase $\phi_3$ and the fourth phase $\phi_4$ in FIG. 13C and FIG. 13D correspond to the fourth phase $\phi_4$ and the fifth phase $\phi_5$ in FIG. 9D and FIG. 9E, respectively. In the fourth phase $\phi_4$, an internal voltage Vs2 of equation (2a) is generated:

$$Vs2 = V_H - Cs/(Cs+Cr2) \times V_H \quad (2a)$$

Figure 13E:
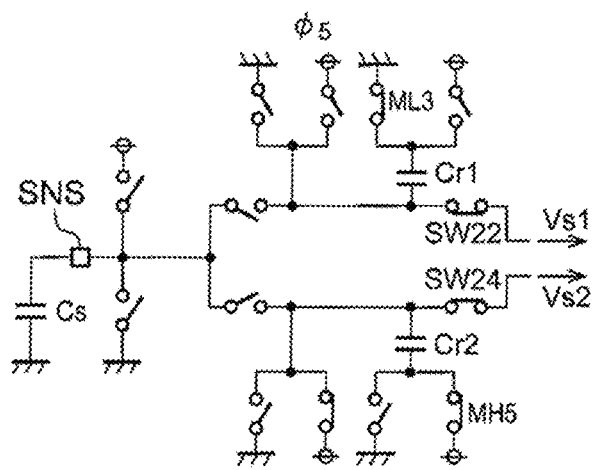

In the fifth phase $\phi_5$ of FIG. 13E, the second switch SW22 and the fourth switch SW24 are closed, and the differential signals Vs1 and Vs2 are supplied to the back-end ADC 220.

Figure 14A:
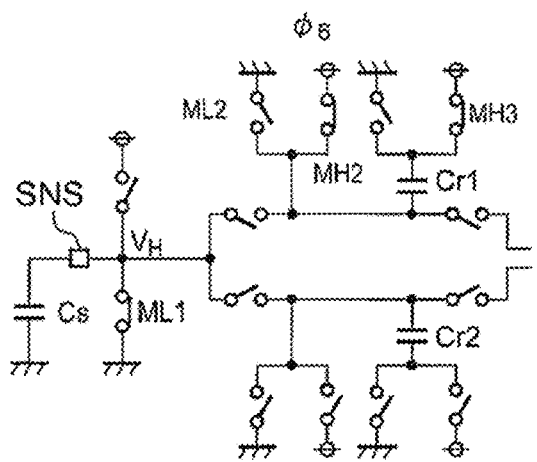
FIG. 14A to FIG. 14E are equivalent circuit diagrams showing an analog front end circuit in a sixth phase $\phi_6$ to a tenth phase $\phi_{10}$.
Figure 14B:
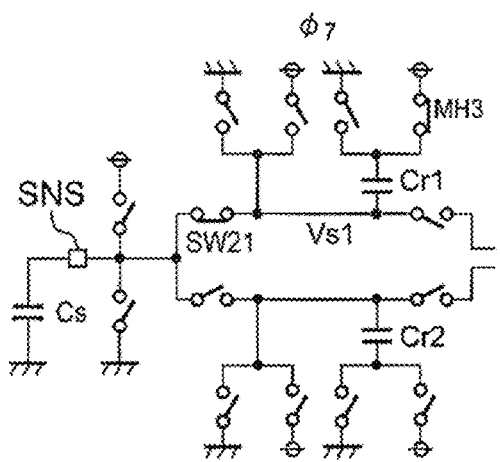

FIG. 14A to FIG. 14F are equivalent circuit diagrams of the analog front end circuit 210 in a sixth phase $\phi_6$, a seventh phase $\phi_7$, to a tenth phase $\phi_{10}$. FIG. 14A and FIG. 14B depict processes performed after polarity inversion in the processes of FIG. 13A and FIG. 13B, respectively, and the internal voltage Vs1 of equation (1b) is generated:

$$Vs1 = V_H - Cs/(Cs+Cr1) \times V_H \quad (1b)$$

Figure 14C:
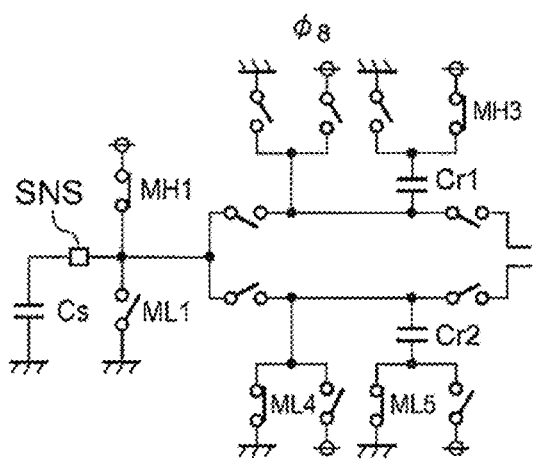
Figure 14D:
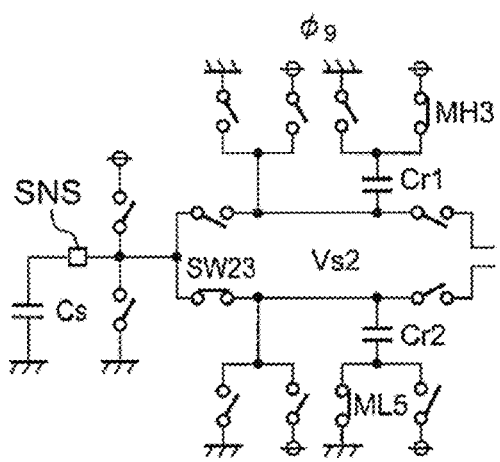

FIG. 14C and FIG. 14D depict processes performed after polarity inversion in the processes of FIG. 13C and FIG. 13D, respectively, and an internal voltage Vs2 of equation (2b) is generated:

$$Vs2 = Cs/(Cs+Cr2) \times V_H \quad (2b)$$

Figure 14E:
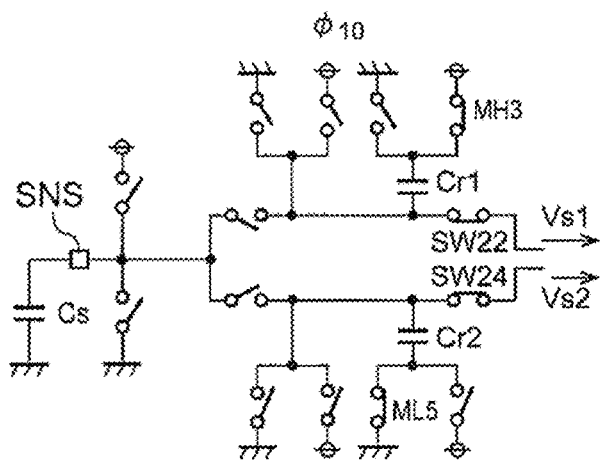

In the tenth phase $\phi_{10}$ in FIG. 14E, the second switch SW22 and the fourth switch SW24 are closed, and the differential signals Vs1 and Vs2 are supplied to the back-end ADC 220.

In addition, it should be understood that a person skilled in the art can switch the orders of the phases in FIG. 13A to FIG. 13E and FIG. 14A to FIG. 14E.

On the basis of the embodiments, specific terms and expressions are used to describe the present disclosure. However, these embodiments only express the principles of the present disclosure and some aspects of applications, and in these embodiments, numerous variation examples and modifications of the configurations without departing from the scope of the concept of the present disclosure specified in the claims are recognized.

Variation Example 1

Figure 15:
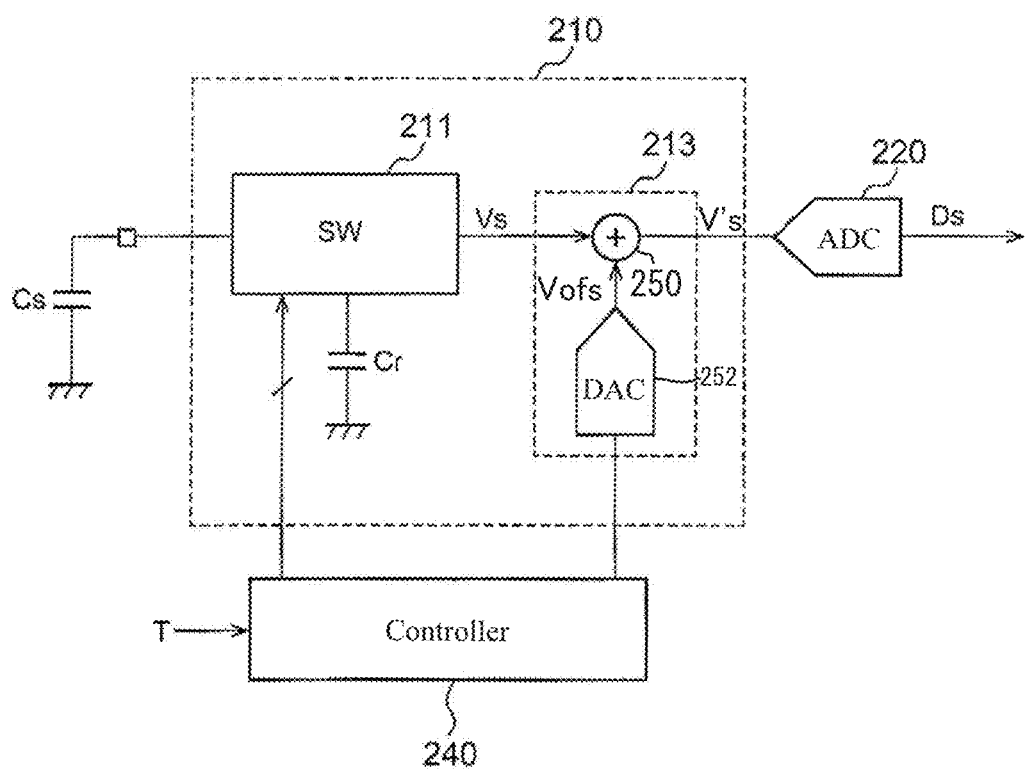
FIG. 15 is a circuit diagram of an alternative embodiment of an analog front end circuit according to the present disclosure.

The approach for adjusting the input-output characteristic of the analog front endcircuit 210 is not limited. FIG. 15 shows a circuit diagram of the analog front end circuit 210 of a variation example. In the variation example, a compensation circuit 213D includes an analog adder 250 and a DAC 252. The controller 240 generates a digital code corresponding to the temperature. The DAC 252 converts the digital code to a voltage signal Vofs. The analog adder 250 adds the voltage signal Vofs to the sensing voltage Vs generated by the switch group 211 and the reference capacitor Cr, so as to generate a compensated sensing voltage Vs'.

Variation Example 2

In some embodiments, the input-output characteristic is not limited to adjusting the offset signal in the output signal Vs of the analog front end circuit 210. A variation value dVs of the sensing voltage Vs with regard to a variation value dCs of the electrostatic capacitance Cs, i.e., a slope $\alpha$, can be adjusted. In this case, the reference capacitor Cr may include a variable capacitor, and the capacitance value of the reference capacitor Cr can be adjusted according to the environmental variation.

Variation Example 3

In the embodiment, the temperature variation is taken as an example of the environmental variation. The environment can include various factors other than temperature that produce influences on the electrostatic capacitance Cs of the sensor electrode SE. In addition to the temperature, humidity can also be an example of the environmental variation.

While various embodiments of the present invention have been described above, it should be understood that they have been presented by way of example only and not by limitation. Further, although several embodiments of the present invention have been discussed, numerous additions, deletions, substitutions, and/or alterations to the invention may be readily suggested to one of skill in the art without departing from the scope of the appended claims. It is intended therefore that the appended claims encompass such additions, deletions, substitutions, and/or alterations. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents. Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which per forms the specified function of the described component (i.e., that is functionally equivalent), even though not structurally equivalent to the disclosed structure which performs the function in the herein illustrated exemplary implementations of the invention. In addition, while a particular feature, structure, or step of the invention may have been disclosed with respect to only one of several implementations, such feature, structure, or step may be mixed and matched from one embodiment to another embodiment, or combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A capacitance detection circuit for detecting an electrostatic capacitance of a sensor electrode, comprising:
   a sense pin, adapted to be connected to the sensor electrode;
   an analog front end circuit coupled to the sense pin and configured to convert the electrostatic capacitance of the sensor electrode to an electrical signal, wherein an input-output characteristic of the analog front end circuit is variable;
   an analog-to-digital converter coupled to the output of the analog front end circuit and configured to convert an output signal of the analog front end circuit to a digital value; and
   a controller coupled to the analog front end circuit and configured to adjust the input-output characteristic of the analog front end circuit according to an environmental variation,
   wherein the analog front end circuit comprises a compensation circuit configured to adjust the input-output characteristic of the analog front end circuit and comprises a compensation capacitor and a driving unit,
   wherein the compensation capacitor has a first end directly coupled to an input of the analog-to-digital converter and a second end directly coupled to the driving unit, and
   wherein the driving unit is controlled by the controller and configured to generate a high voltage or a low voltage in different phases.

2. The capacitance detection circuit of claim 1, wherein the environmental variation is a temperature variation.

3. The capacitance detection circuit of claim 2, further comprising a temperature sensor that is adapted to sense the temperature adjacent to the sensor electrode wherein the controller is configured to control the analog front end circuit according to an output of the temperature sensor.

4. The capacitance detection circuit of claim 2, wherein the controller controls the analog front end circuit based on an external temperature.

5. The capacitance detection circuit of claim 1, wherein the analog front end circuit further comprises:
   a reference capacitor; and
   a switch group, comprising a plurality of switches;
   wherein the analog front end circuit is configured to convert the electrostatic capacitance into a voltage signal by transmitting electrical charges between the reference capacitor and the sensor electrode.

6. The capacitance detection circuit of claim 1, wherein the compensation capacitor has a variable capacitance, wherein the controller is configured to adjust a capacitance of the compensation capacitor according to the environmental variation.

7. The capacitance detection circuit of claim 1, wherein the capacitance detection circuit is integrated in one semiconductor integrated circuit.

8. An input device, comprising:
   a panel, comprising a sensor electrode having an electrostatic capacitance, wherein the sensor electrode is adapted to change the electrostatic capacitance when a position proximal to the sensor electrode is touched; and
   the capacitance detection circuit of claim 1, connected to the sensor electrode.

9. An input device, comprising:
   a panel, comprising a sensor electrode having an electrostatic capacitance, wherein the sensor electrode is adapted to change the electrostatic capacitance when a position proximal to the sensor electrode is touched; and
   the capacitance detection circuit of claim 2, connected to the sensor electrode.

10. An input device, comprising:
    a panel, comprising a sensor electrode having an electrostatic capacitance, wherein the sensor electrode is adapted to change the electrostatic capacitance when a position proximal to the sensor electrode is touched; and
    the capacitance detection circuit of claim 1, connected to the sensor electrode.

11. An input device, comprising:
    a panel, comprising a sensor electrode having an electrostatic capacitance, wherein the sensor electrode is adapted to change the electrostatic capacitance when a position proximal to the sensor electrode is touched; and
    the capacitance detection circuit of claim 5, connected to the sensor electrode.

12. An input device, comprising:
    a panel, comprising a sensor electrode having an electrostatic capacitance, wherein the sensor electrode is adapted to change the electrostatic capacitance when a position proximal to the sensor electrode is touched; and
    the capacitance detection circuit of claim 7, connected to the sensor electrode.

13. The capacitance detection circuit of claim 1, wherein the controller is configured to detect the environmental variation based on an output of the analog-to-digital converter.

14. A capacitance detection circuit for detecting an electrostatic capacitance of a sensor electrode, comprising:
    a sense pin, adapted to be connected to the sensor electrode;
    an analog front end circuit coupled to the sense pin and configured to convert the electrostatic capacitance of the sensor electrode to an electrical signal, wherein an input-output characteristic of the analog front end circuit is variable, wherein the analog front end circuit further comprises:

a reference capacitor, wherein the sense pin is arranged between the reference capacitor and the electrostatic capacitance of the sensor electrode; and a switch group, comprising a plurality of switches including a first switch, wherein the first switch has a first end and a second end directly connected to the sense pin and the reference capacitor, respectively;

wherein the analog front end circuit is configured to convert the electrostatic capacitance into a voltage signal by transmitting electrical charges between the reference capacitor and the sensor electrode;

an analog-to-digital converter coupled to the output of the analog front end circuit and configured to convert an output signal of the analog front end circuit to a digital value; and a controller coupled to the analog front end circuit and configured to adjust the input-output characteristic of the analog front end circuit according to an environmental variation.

* * * * *